US012724453B1

(12) United States Patent
Sibbesen et al.

(10) Patent No.: US 12,724,453 B1
(45) Date of Patent: Sep. 1, 2026

(54) PORTABLE ELECTRONIC DEVICE CASE MODULAR PORT SYSTEM

(71) Applicant: Pioneer Square Brands, Inc., High Point, NC (US)

(72) Inventors: Soren Sibbesen, Jamestown, NC (US); Brian Lewis Piper, Seattle, WA (US); Quentin Wade Forbes, Winston Salem, NC (US); Richard Kennedy, Antioch, TN (US)

(73) Assignee: Pioneer Square Brands, Inc., High Point, NC (US)

( * ) Notice: Subject to any disclaimer, the term of this patent is extended or adjusted under 35 U.S.C. 154(b) by 0 days.

(21) Appl. No.: 19/424,189

(22) Filed: Dec. 18, 2025

Related U.S. Application Data

(60) Provisional application No. 63/789,384, filed on Apr. 15, 2025.

(51) Int. Cl.

| | |
|---|---|
| ***H05K 5/00*** | (2025.01) |
| ***G06F 1/16*** | (2006.01) |
| ***H01R 31/06*** | (2006.01) |
| ***H05K 5/02*** | (2006.01) |

(52) U.S. Cl.
CPC .......... *G06F 1/1628* (2013.01); *G06F 1/1658* (2013.01); *H01R 31/065* (2013.01); *H05K 5/0247* (2013.01); *H01R 2201/04* (2013.01); *H01R 2201/06* (2013.01)

(58) Field of Classification Search
None
See application file for complete search history.

(56) References Cited

U.S. PATENT DOCUMENTS

| | | | | |
|---|---|---|---|---|
| 7,595,981 | B2 * | 9/2009 | Chen | G06F 1/1632 455/518 |
| 8,831,538 | B2 * | 9/2014 | Yuen | G06F 3/011 455/556.1 |
| 11,936,800 | B1 * | 3/2024 | Balutkar | H04M 1/026 |
| 2013/0323981 | A1 * | 12/2013 | Tseng | H01R 31/065 439/653 |
| 2021/0057928 | A1 * | 2/2021 | Tivas | H02J 7/00 |

* cited by examiner

*Primary Examiner* — Imani N Hayman
*Assistant Examiner* — Rashen E Morrison
(74) *Attorney, Agent, or Firm* — Grandview Law

(57) ABSTRACT

A case system for a portable electronic device having an electrical port includes (I) a modular port assembly including (A) a front including at least one electrical port, (B) an electrical plug removably electrically couplable with the electrical port of the portable electronic device; and (II) a case assembly including (A) an interior formed in part by a base and an interior side, the interior side perpendicularly extending from the base, and (B) an exterior side, and (C) an aperture extending from the interior side to the exterior side, wherein the aperture is sized and shaped to couple with the modular port assembly such that when the modular port assembly is coupled with the aperture, the plug of the modular port assembly extends into the interior of the case assembly. Other aspects are described in the claims, drawings, and text forming a part of the present disclosure.

20 Claims, 22 Drawing Sheets

PORTABLE ELECTRONIC DEVICE CASE MODULAR PORT SYSTEM

In one or more aspects a case system for a portable electronic device including an electrical port includes: (I) a modular port assembly including (A) a front including at least one electrical port, (B) an electrical plug removably electrically couplable with the electrical port of the portable electronic device; and (II) a case assembly including (A) an interior formed in part by a base and an interior side, the interior side perpendicularly extending from the base, and (B) an exterior side, and (C) an aperture extending from the interior side to the exterior side, wherein the aperture is sized and shaped to couple with the modular port assembly such that when the modular port assembly is coupled with the aperture, the plug of the modular port assembly extends into the interior of the case assembly.

In implementations wherein the aperture has at least one beveled surface, and wherein the modular port assembly has at least one beveled surface with slope to engage the at least one beveled surface of the aperture when the modular port assembly is coupled with the aperture.

In implementations wherein the aperture has at least one flat surface, and wherein the modular port assembly has at least one flat surface to engage with the at least one flat surface of the aperture when the modular port assembly is coupled with the aperture.

In implementations wherein the aperture has at least one width, and wherein the modular port assembly has at least one width to engage the at least one width of the aperture when the modular port assembly is coupled with the aperture.

In implementations wherein the aperture has at least one length, and wherein the modular port assembly has at least one length to engage the at least one length of the aperture when the modular port assembly is coupled with the aperture.

In implementations wherein the plug complies with at least one universal serial bus standard.

In implementations wherein the plug complies with a networking standard.

In implementations wherein the plug complies with at least one IEEE 802 standard.

In implementations wherein the at least one electrical port is an audio port.

In implementations wherein the at least one electrical port is an electrical power port.

In implementations wherein the at least one electrical port is a video port.

In implementations wherein the at least one electrical port is a network communication port.

In implementations wherein the at least one electrical port complies with at least one IEEE 802 standard.

In implementations wherein the at least one electrical port complies with at least one universal serial bus standard.

In one or more aspects a case system for a portable electronic device including an electrical port includes: (I) a modular port assembly including (A) at least one electrical port, (B) an electrical plug; and (II) a case assembly including (A) an interior formed in part by a base and an interior side, the interior side perpendicularly extending from the base, and (B) an exterior side, and (C) an aperture extending from the interior side to the exterior side, wherein the aperture is sized and shaped to couple with the modular port assembly such that when the modular port assembly is coupled with the aperture, the plug of the modular port assembly extends into the interior of the case assembly.

In implementations wherein the plug complies with at least one universal serial bus standard.

In implementations wherein the at least one electrical port is an audio port.

In one or more aspects a case system for a portable electronic device including an electrical port includes: (I) a modular port assembly including (A) a front including at least one electrical port, (B) an electrical plug removably electrically couplable with the electrical port of the portable electronic device; and (II) a case assembly including (A) an interior, and (B) an aperture, wherein the aperture is sized and shaped to couple with the modular port assembly such that when the modular port assembly is coupled with the aperture, the plug of the modular port assembly extends into the interior of the case assembly.

In implementations wherein the at least one electrical port is an electrical power port.

In implementations wherein the at least one electrical port complies with at least one universal serial bus standard.

In addition to the foregoing, other aspects are described in the claims, drawings, and text forming a part of the disclosure set forth herein. Various other aspects are set forth and described in the teachings such as text (e.g., claims and/or detailed description) and/or drawings of the present disclosure. The foregoing is a summary and thus may contain simplifications, generalizations, inclusions, or omissions of detail; consequently, those skilled in the art will appreciate that the summary is illustrative only and is NOT intended to be in any way limiting. Other aspects, features, and advantages of the devices and/or processes and/or other subject matter described herein will become apparent in the teachings set forth herein.

BRIEF DESCRIPTION OF THE FIGURES

For a more complete understanding of implementations, reference now is made to the following descriptions taken in connection with the accompanying drawings. The use of the same symbols in different drawings typically indicates similar or identical items, unless context dictates otherwise.

With reference now to the figures, shown are one or more examples of Portable Electronic Device Case Modular Port System, articles of manufacture, compositions of matter for same that may provide context, for instance, in introducing one or more processes and/or devices described herein.

DETAILED DESCRIPTION

Figure 1:
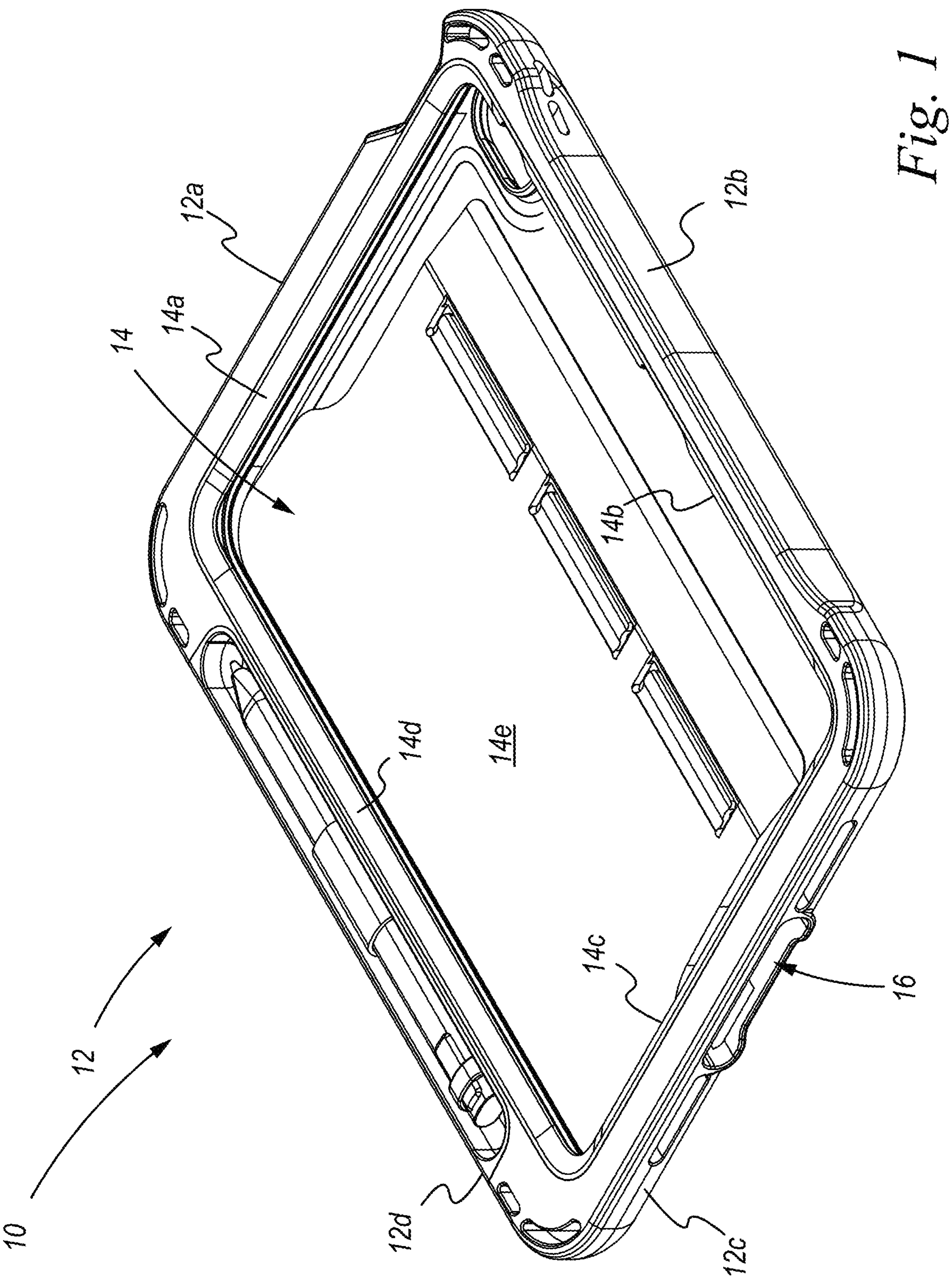
FIG. 1 is a top front perspective view of a case assembly.

In the following detailed description, reference is made to the accompanying drawings, which form a part hereof. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here.

Turning to FIG. 1, depicted therein is a top-front perspective view of case assembly 10 including exterior 12, interior 14, and aperture 16. Exterior 12 includes sides 12*a*, 12*b*, 12*c*, and 12*d*, forming a generally rectangular outer boundary. Interior 14 includes sides 14*a*, 14*b*, 14*c*, 14*d*, and base 14*e*, which together define a recessed cavity sized to receive a portable electronic device. Case assembly 10 includes aperture 16, which extends through one of the exterior sides and communicates with the interior, providing an opening for mechanical and electrical coupling of a modular port assembly. The configuration may be formed by molding, machining, or composite fabrication and may vary in thickness or curvature depending on application.

Figure 2:
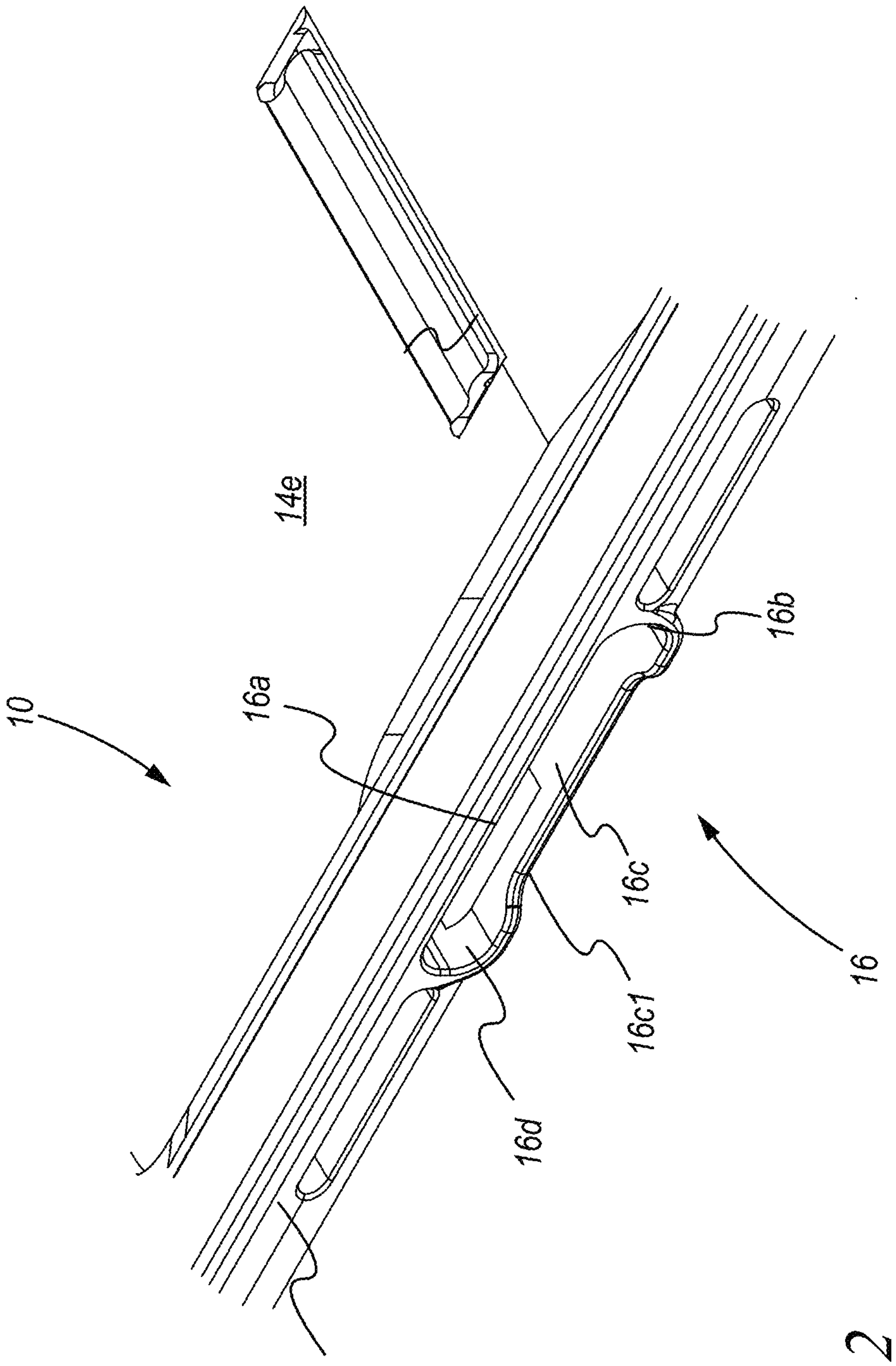
FIG. 2 is an enlarged top front perspective view of a portion of the case assembly of FIG. 1.

Turning to FIG. 2, depicted therein is an enlarged top-front perspective view of a portion of case assembly 10 showing details of aperture 16. Aperture 16 includes sides 16*a*, 16*b*, 16*c*, and 16*d*, with indent 16*c*1 formed along side 16*c*. The indent provides a localized recess or keyed region for alignment or retention of a modular port assembly. The aperture extends through exterior side 12*c* and may include draft, bevel, or flat surfaces for guiding and securing the module. The surrounding wall region may vary in thickness to accommodate structural or sealing requirements.

Figure 3:
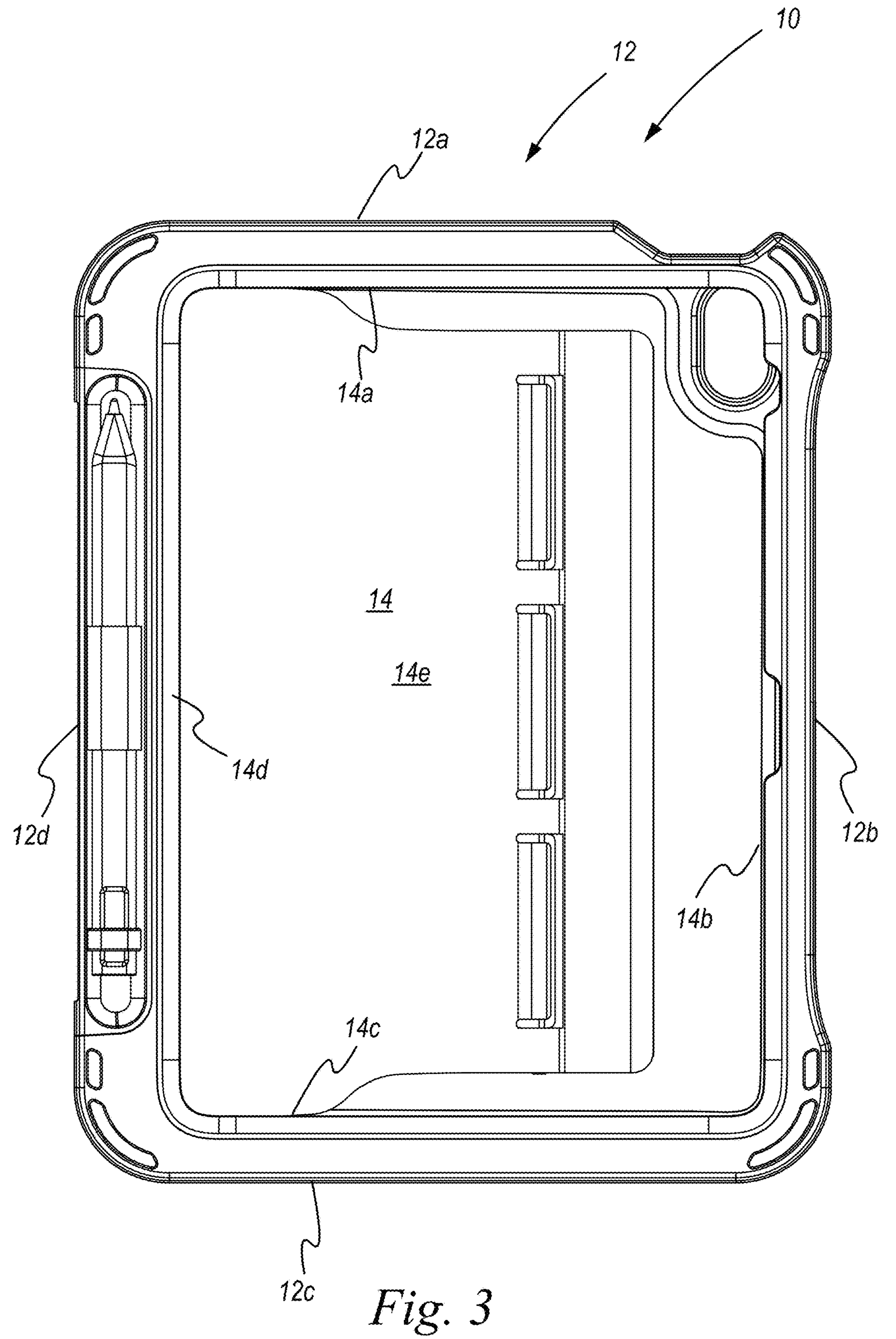
FIG. 3 is a top plan view of the case assembly of FIG. 1.

Turning to FIG. 3, depicted therein is a top plan view of case assembly 10 showing the overall footprint of the structure. Exterior 12 defines the outer perimeter through sides 12*a*, 12*b*, 12*c*, and 12*d*, while interior 14 defines the inner cavity through sides 14*a*, 14*b*, 14*c*, 14*d*, and base 14*e*. The spacing between the interior and exterior sides establishes the wall thickness that supports and protects the housed device. The base extends across the footprint to support the device and provide a datum for optional mounting or cushioning features. The geometry may vary in curvature or proportion according to device size or case profile.

Figure 4:
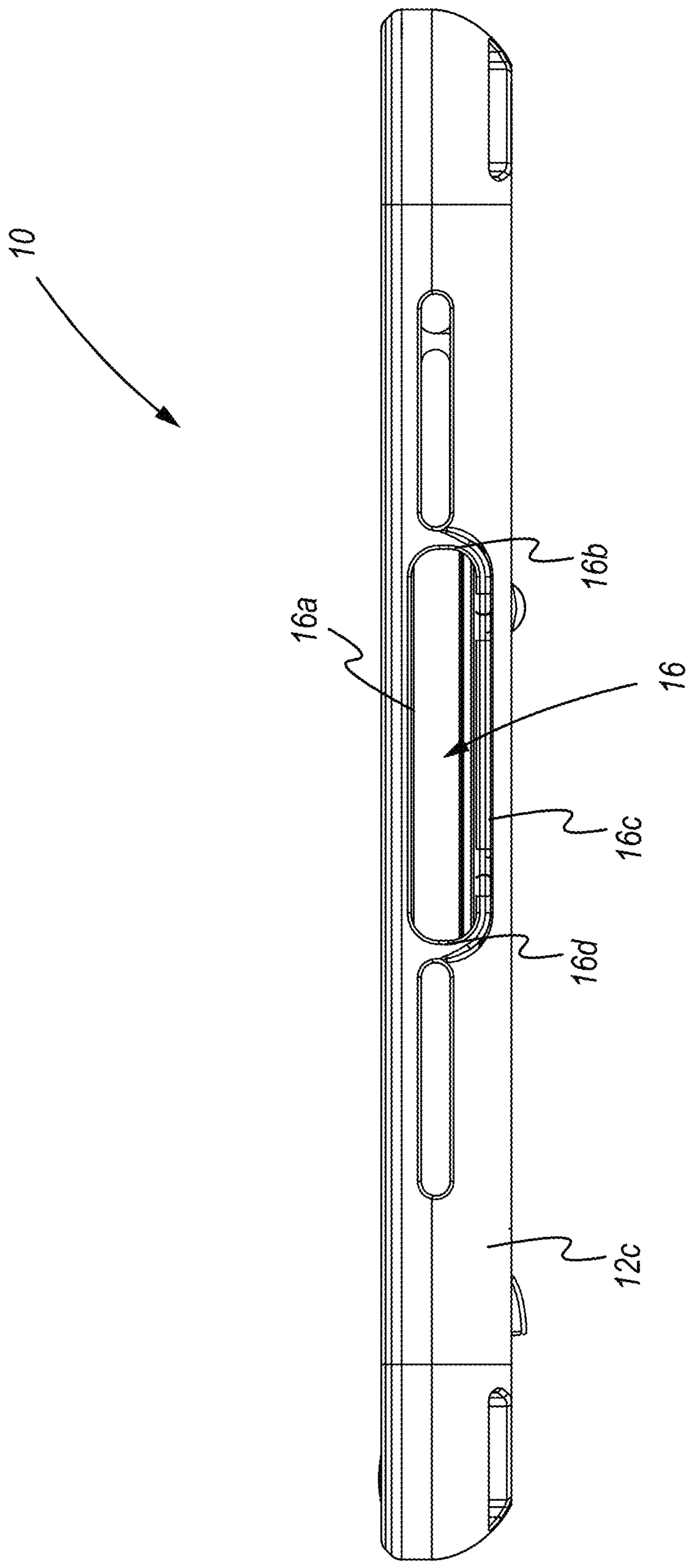
FIG. 4 is a front elevational view of the case assembly of FIG. 1.

Turning to FIG. 4, depicted therein is a front elevational view of case assembly 10 showing aperture 16 positioned in exterior side 12*c*. Aperture 16 is bounded by sides 16*a*, 16*b*, 16*c*, and 16*d*, defining a generally rectangular opening extending through the case wall. The surrounding exterior surface provides a continuous region for the modular port assembly to seat flush against when installed. The wall thickness and uniform spacing of sides 16*a*-16*d* support accurate alignment and sealing. In implementations, the aperture may include chamfers or radiused edges to facilitate insertion or retention of the module.

Figure 5:
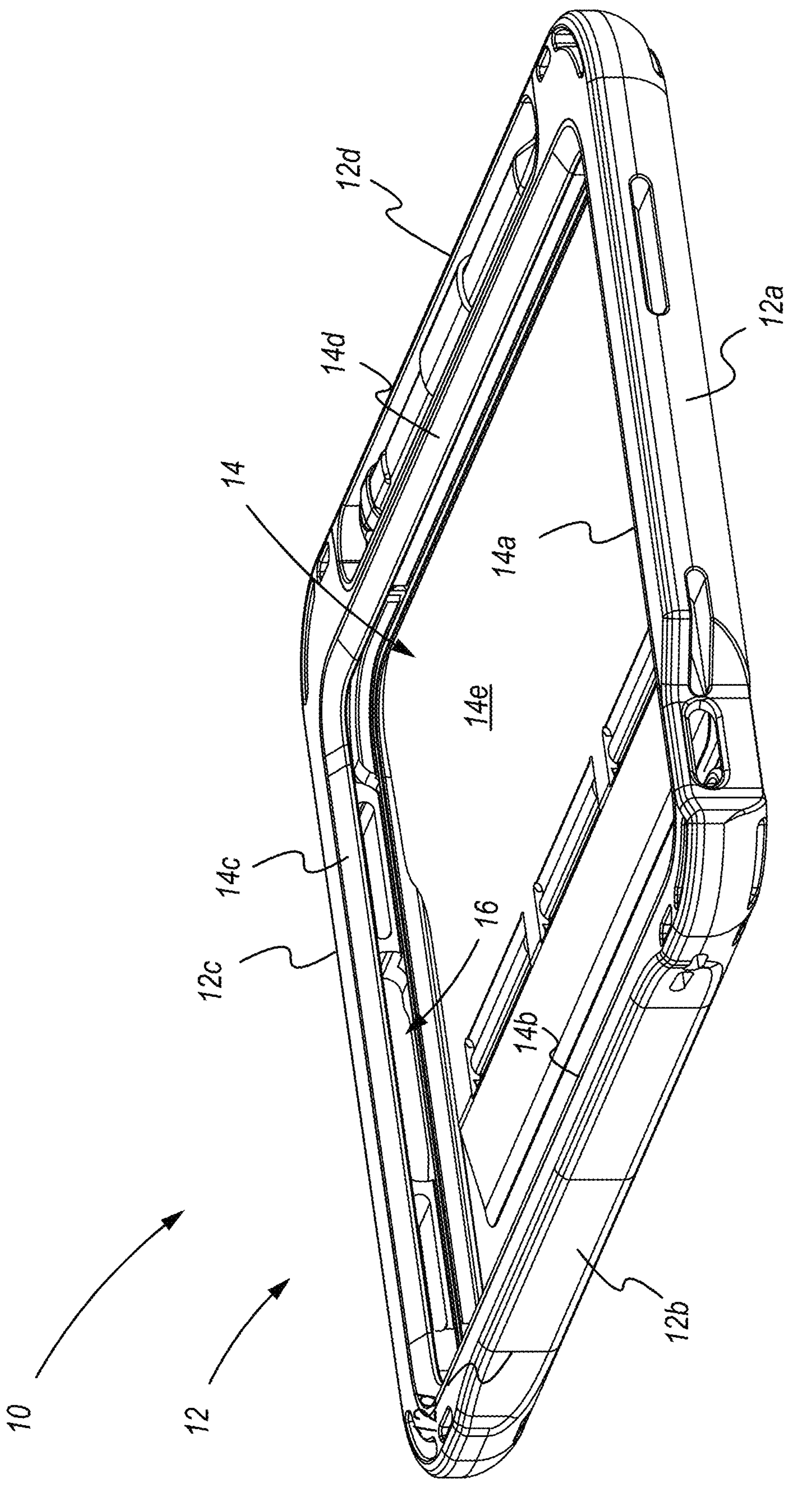
FIG. 5 is a top rear perspective view of the case assembly of FIG. 1.

Turning to FIG. 5, depicted therein is a top-rear perspective view of case assembly 10 showing interior 14, exterior 12, and aperture 16 in spatial relation. Base 14*e* forms the lower surface of the interior cavity, and sides 14*a*, 14*b*, 14*c*, and 14*d* extend perpendicularly from the base. Exterior 12 includes sides 12*a*, 12*b*, 12*c*, and 12*d*, with side 12*d* visible as the rear wall. Aperture 16 passes fully through the wall of side 12*c*, opening into the interior cavity. The view illustrates the overall enclosure geometry and the continuity of the aperture between inner and outer surfaces, which may be adapted in thickness or contour for different case materials.

Figure 6:
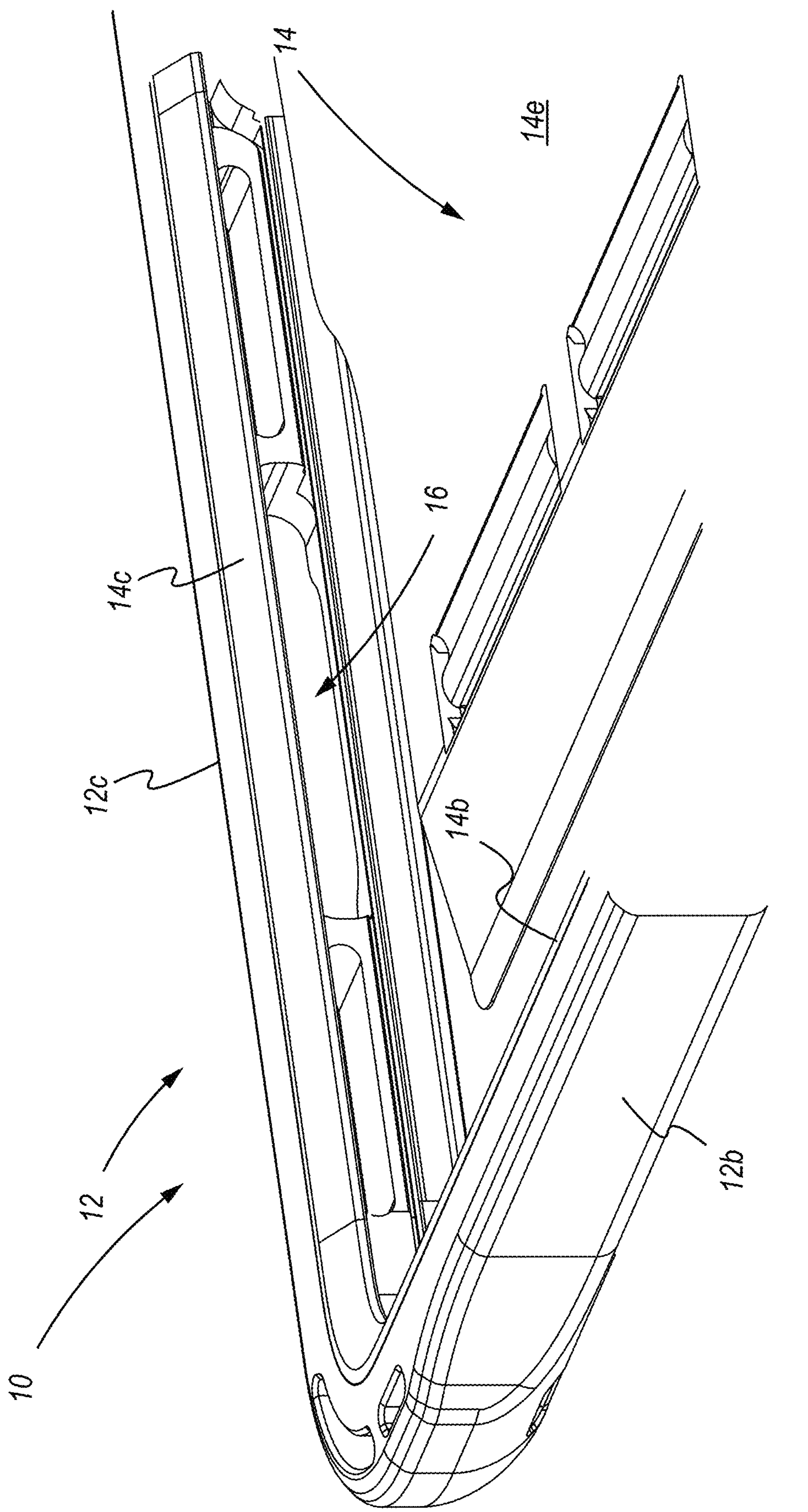
FIG. 6 is an enlarged top rear perspective view of a portion of the case assembly of FIG. 1.

Turning to FIG. 6, depicted therein is an enlarged top-rear perspective view of a portion of case assembly 10 highlighting the corner region adjacent to aperture 16. Exterior sides 12*b* and 12*c* meet at the corner, merging with corresponding interior sides 14*b* and 14*c* of interior 14. The aperture extends through side 12*c*, showing the transition from the exterior surface to the interior cavity. The edge contours may include draft or bevel features to guide insertion of a modular port assembly. The wall thickness at this junction may be varied to provide reinforcement or sealing support.

Figure 7:
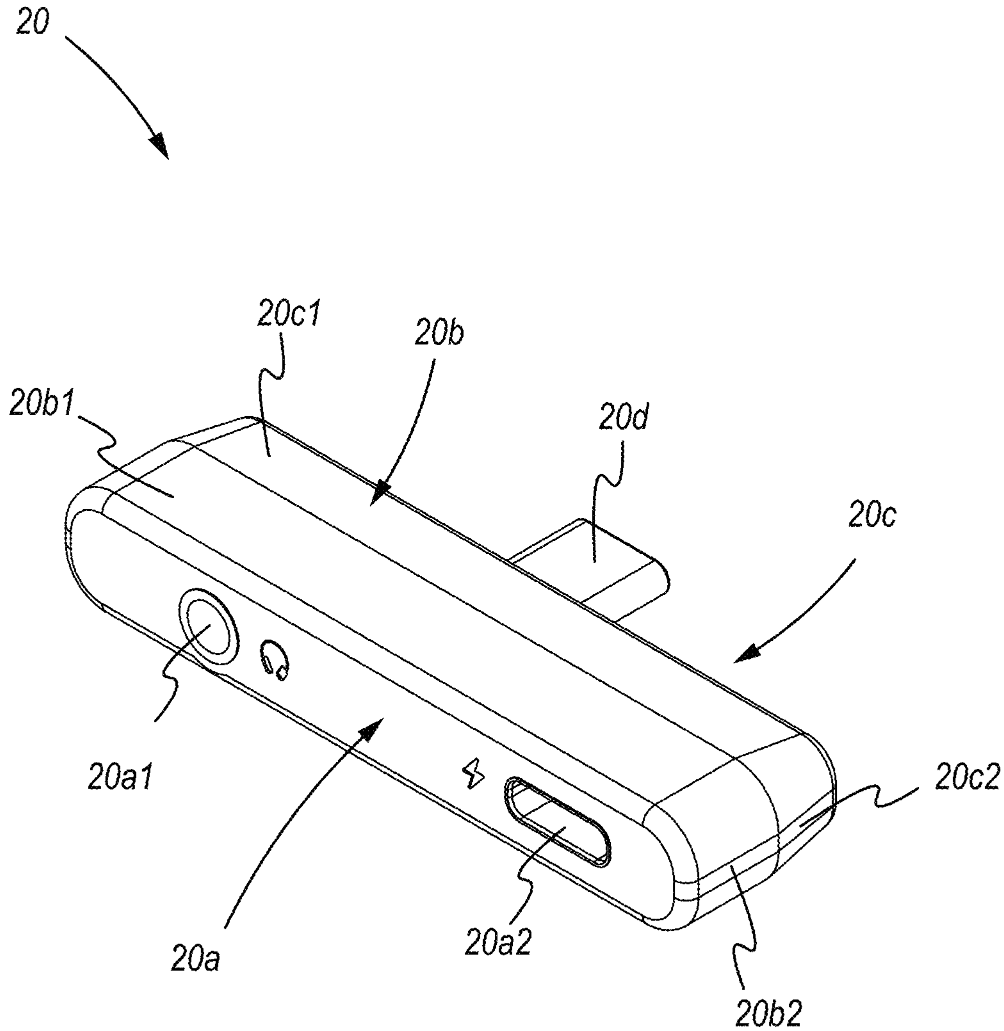
FIG. 7 is a front top perspective view of a modular port assembly.

Turning to FIG. 7, depicted therein is a front-top perspective view of modular port assembly 20 including front 20*a* with ports 20*a*1 and 20*a*2, flat portion 20*b* with sides 20*b*1 and 20*b*2, bevel 20*c* with sides 20*c*1 and 20*c*2, and plug 20*d*. Front 20*a* defines the exposed face when installed, while ports 20*a*1 and 20*a*2 provide electrical connection points. Flat portion 20*b* and bevel 20*c* together form the seating region that engages the aperture of the case assembly. Plug 20*d* projects rearward for coupling with the corresponding port of a portable electronic device. The body may be molded or machined and configured for single or multiple electrical standards.

Figure 8:
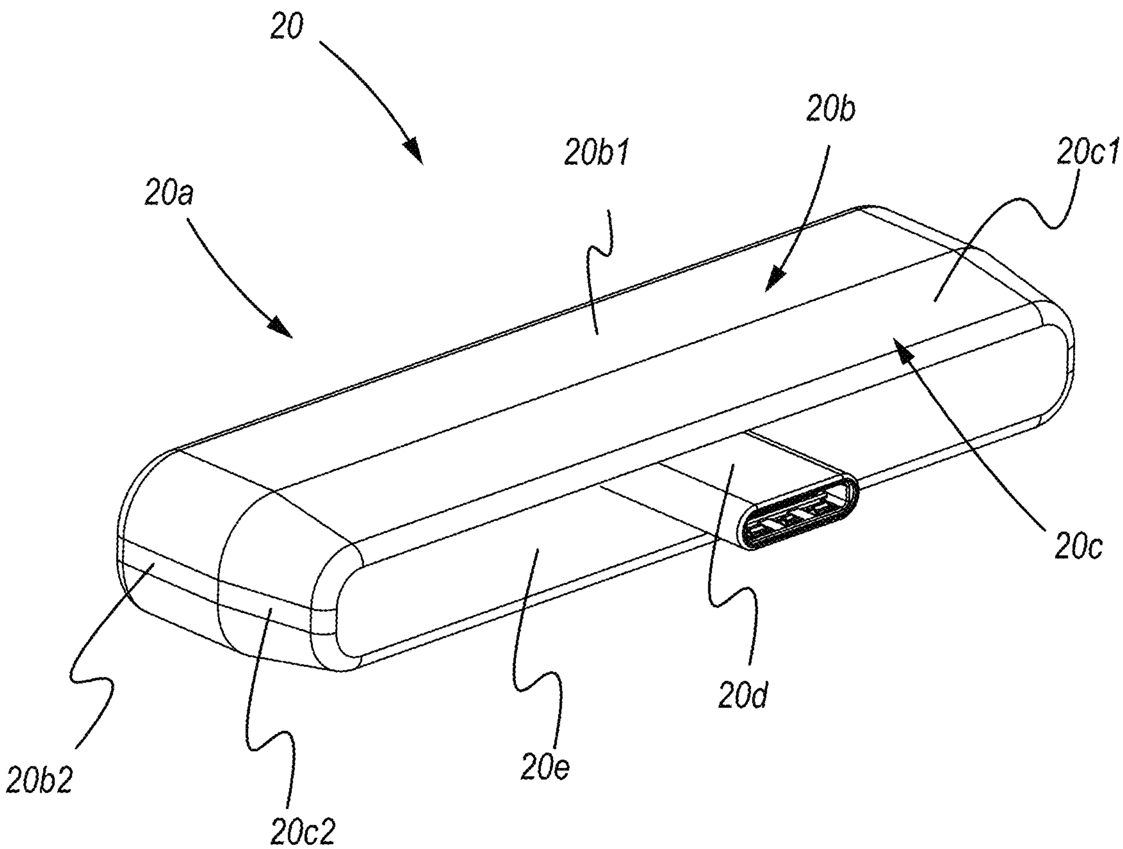
FIG. 8 is a rear top perspective view of the modular port assembly of FIG. 7.

Turning to FIG. 8, depicted therein is a rear-top perspective view of modular port assembly 20 showing back 20*e* and the rearward extension of plug 20*d*. The plug is centrally aligned and configured to couple with the device port inside the case assembly. The transition between flat portion 20*b*, bevel 20*c*, and back 20*e* maintains a uniform profile for alignment and sealing. The rear face may include structural or environmental features such as gaskets or retaining shoulders as required by implementation.

Figure 9:
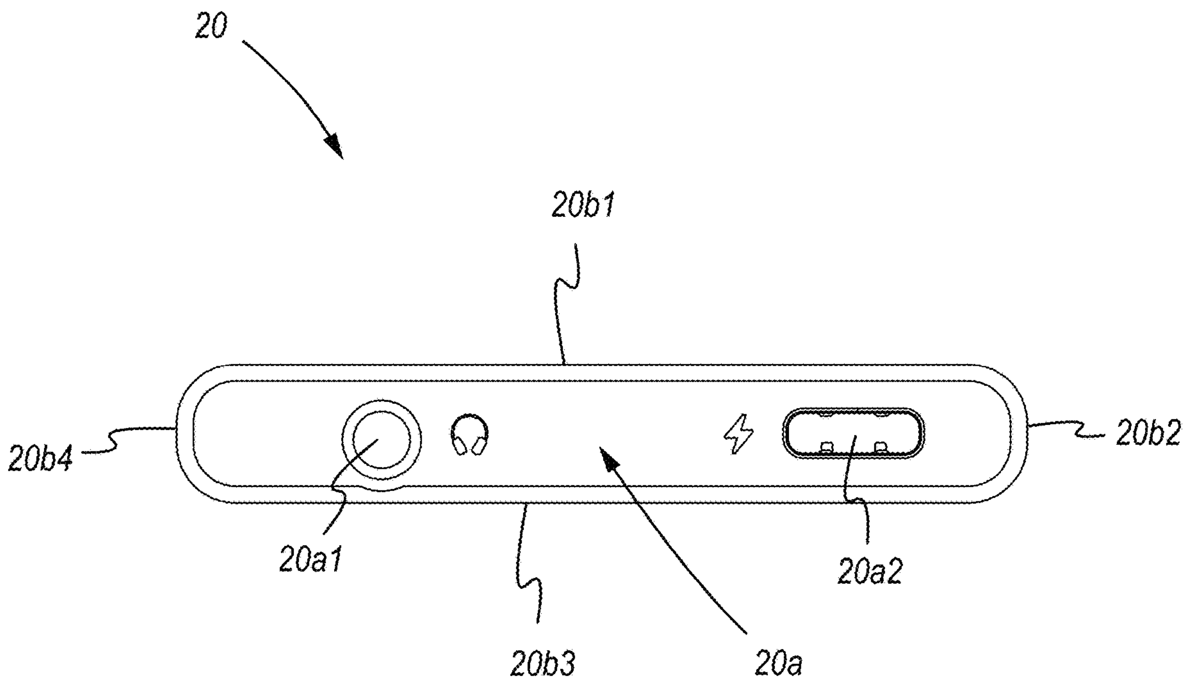
FIG. 9 is a front elevational view of the modular port assembly of FIG. 7.

Turning to FIG. 9, depicted therein is a front elevational view of modular port assembly 20 showing front 20*a* with ports 20*a*1 and 20*a*2, and flat portion 20*b* including sides 20*b*3 and 20*b*4. The ports are arranged laterally across the front face for simultaneous access. Sides 20*b*3 and 20*b*4 extend vertically along the flat portion, providing alignment and seating contact within the case aperture. The front face may overlap the case exterior to form a flush or sealed interface. Port size and spacing can vary according to connector type and electrical standard.

Figure 10:
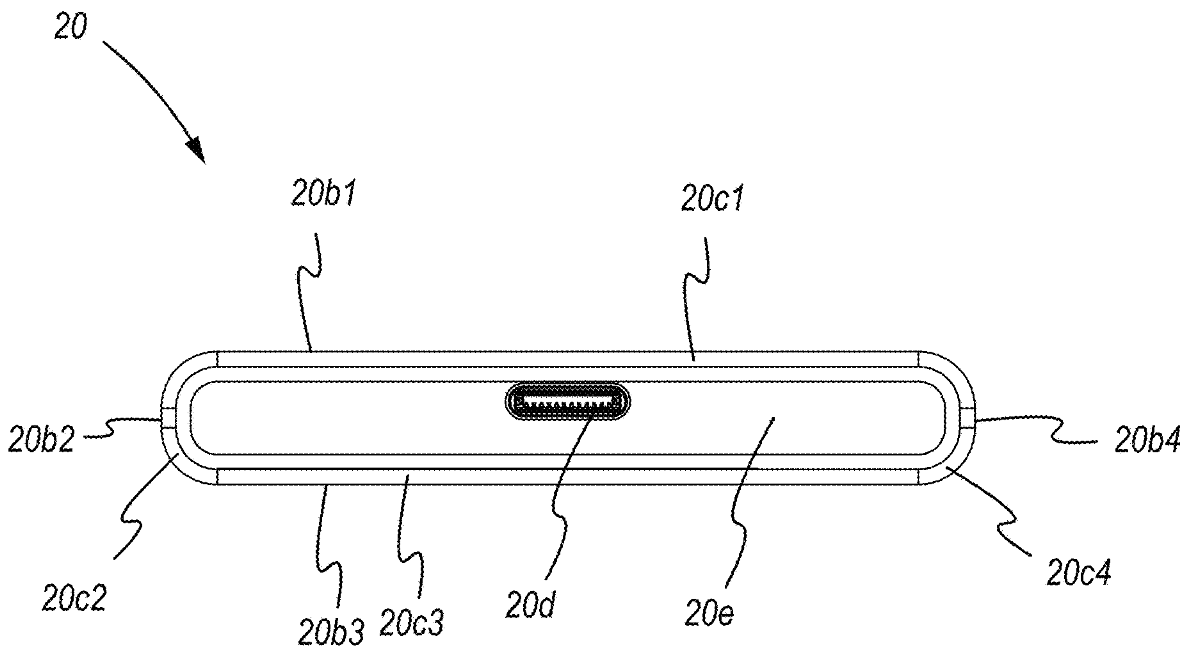
FIG. 10 is a rear elevational view of the modular port assembly of FIG. 7.

Turning to FIG. 10, depicted therein is a rear elevational view of modular port assembly 20 showing back 20*e* and bevel region 20*c* including sides 20*c*3 and 20*c*4. The bevel sides taper inward toward the rear to guide insertion and provide seating engagement within the case aperture. The rear face aligns coaxially with plug 20*d*, maintaining centered electrical coupling with the portable electronic device. The slope and spacing of sides 20*c*3-20*c*4 may be adjusted to achieve desired retention force, sealing, or fit tolerance.

Figure 11:
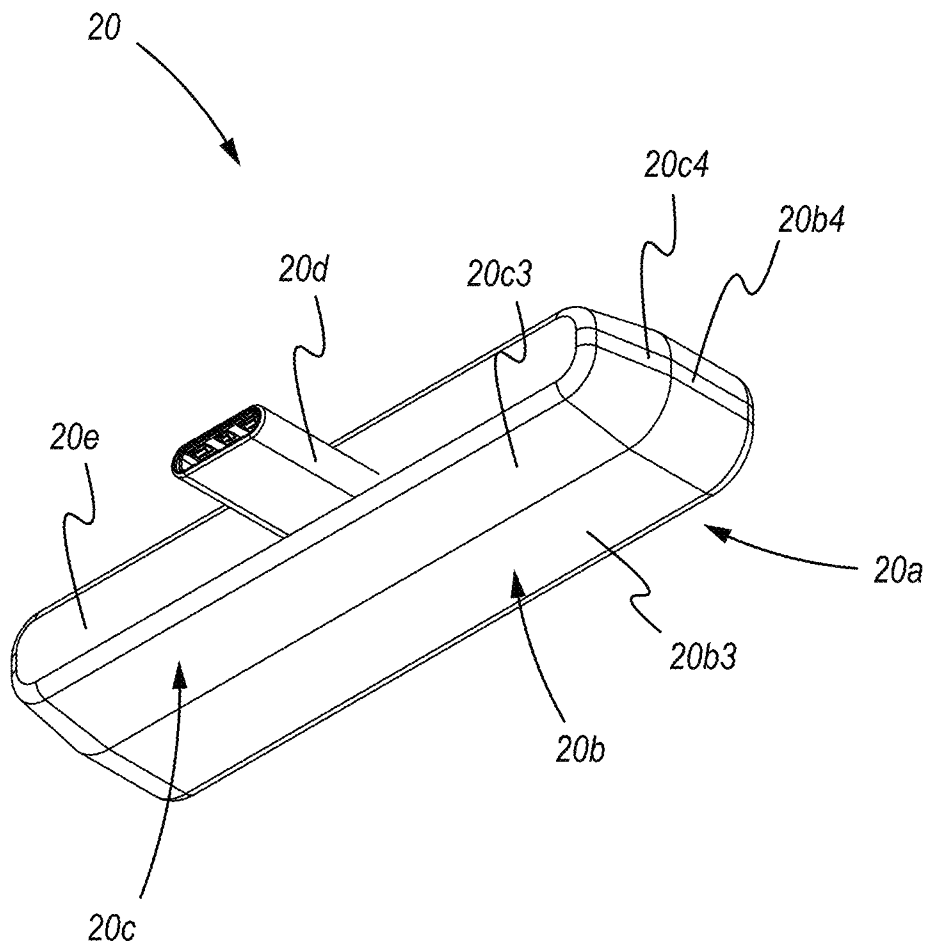
FIG. 11 is a rear bottom perspective view of the modular port assembly of FIG. 7.

Turning to FIG. 11, depicted therein is a rear-bottom perspective view of modular port assembly 20 showing the underside configuration of the module. The figure reveals the rearward projection of plug 20*d* from back 20*e*, as well as the transition between the lower portions of flat section 20*b* and bevel section 20*c*. The bottom geometry defines the clearance and insertion path relative to the lower interior surface of the case aperture. The lower edges of the bevel may include radiused or chamfered features to facilitate smooth coupling and provide strain relief at the interface region.

Figure 12:
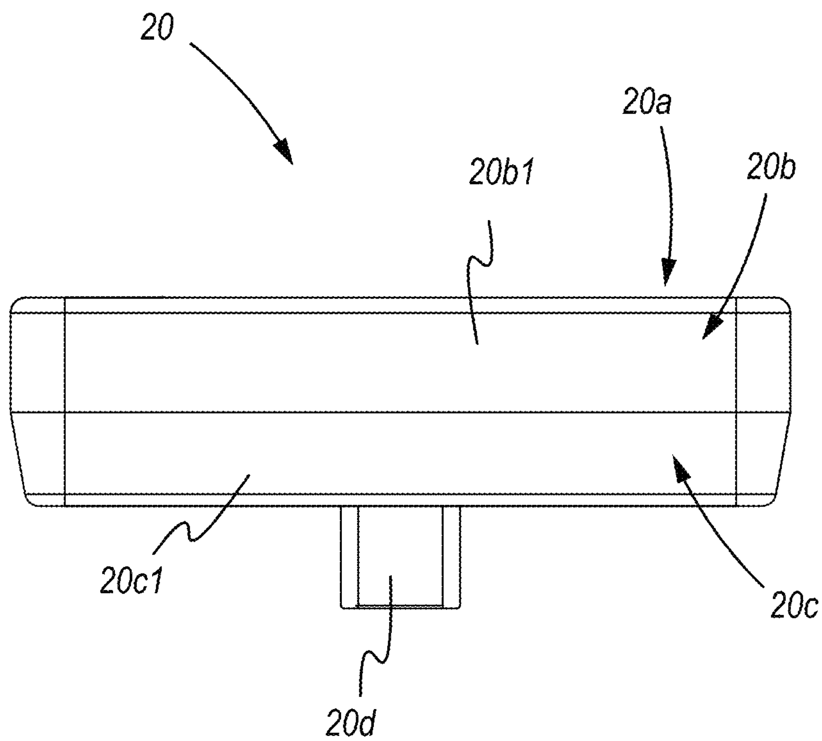
FIG. 12 is a top plan view of the modular port assembly of FIG. 7.

Turning to FIG. 12, depicted therein is a top plan view of modular port assembly 20 showing the arrangement of its major surfaces and alignment of components. Front 20*a* defines the leading edge, followed by flat portion 20*b* and bevel portion 20*c*, which transition toward back 20*e*. Ports 20*a*1 and 20*a*2 are positioned symmetrically across the front, and plug 20*d* extends axially from the rear centerline. The top view establishes the proportional relationship among these features and the uniform width of the body, which may vary according to connector format or case aperture dimensions.

Figure 13:
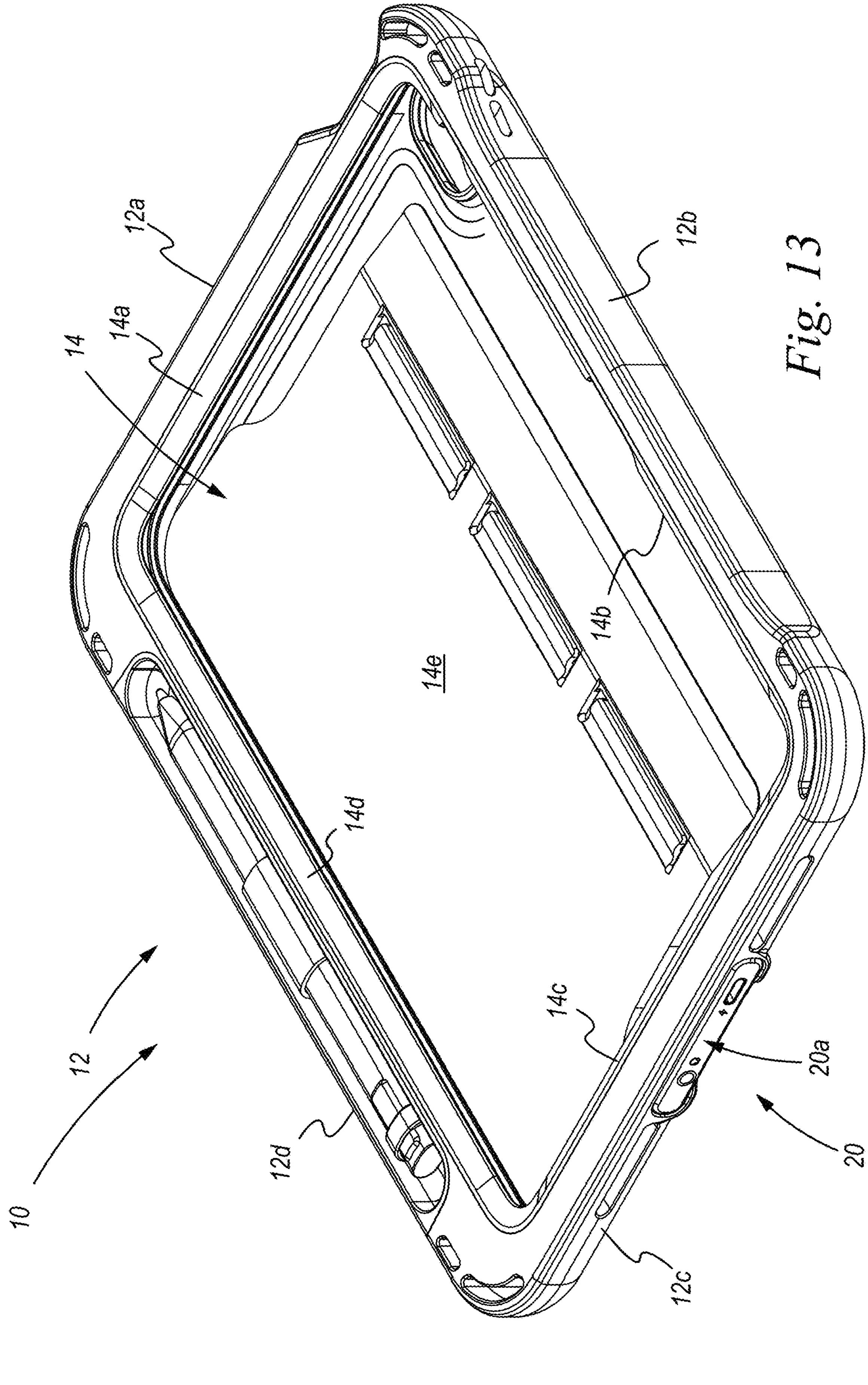
FIG. 13 is a top front perspective view of the case assembly of FIG. 1 coupled with the modular port assembly of FIG. 7.
Figure 14:
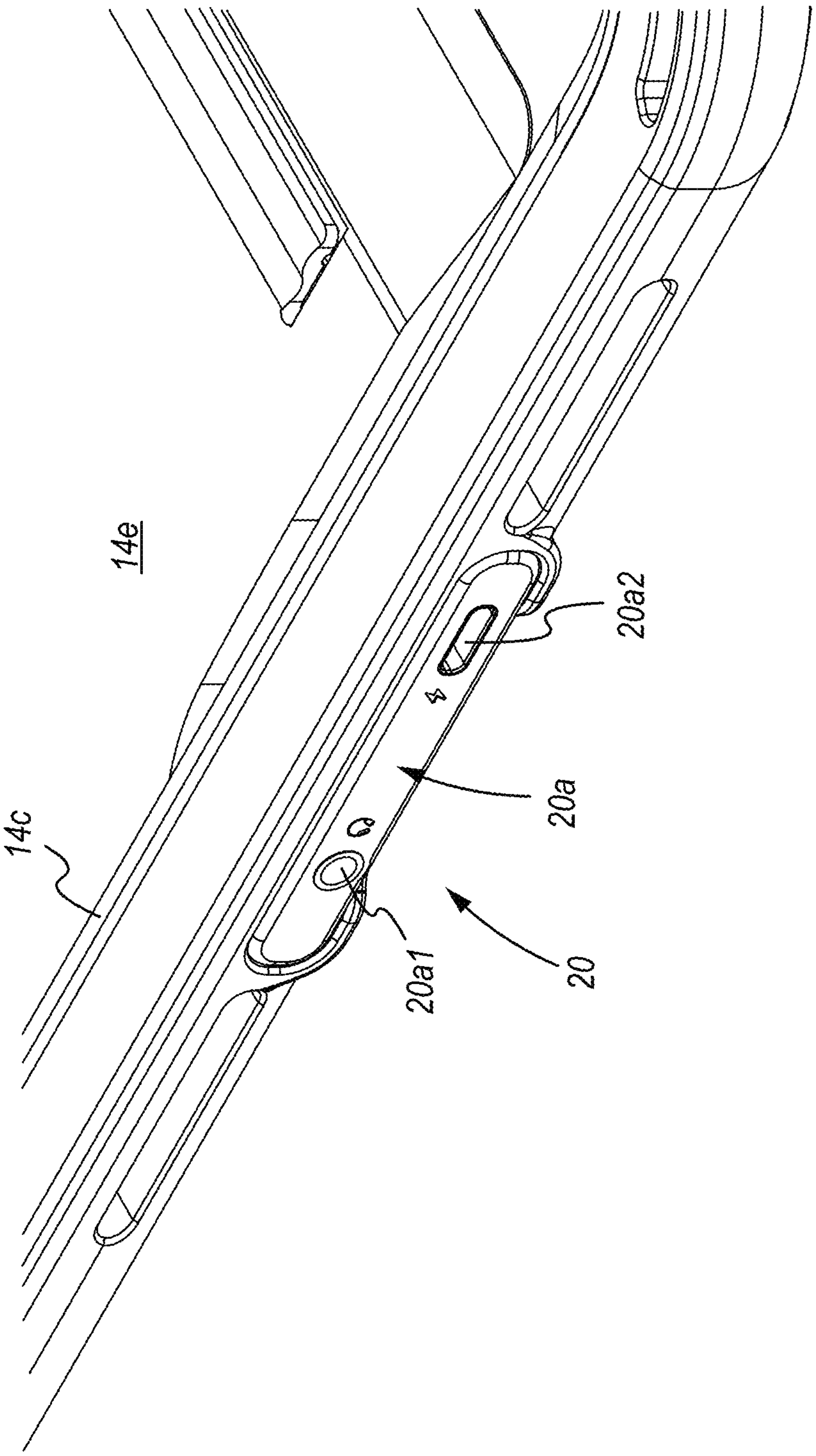
FIG. 14 is an enlarged portion of the top front perspective view of the case assembly of FIG. 1 coupled with the modular port assembly of FIG. 7.

Turning to FIGS. 13 and 14, depicted therein is a top-front perspective view of case assembly 10 coupled with modular port assembly 20. Aperture 16 of the case receives the module such that plug 20*d* extends inward toward the case interior and front 20*a* remains flush with exterior 12. FIG. 14 shows the engagement of flat portion 20*b* and bevel 20*c* within the corresponding wall features of the aperture, aligning sides 16*a*-16*d* with sides 20*b*1-20*b*4 and 20*c*1-20*c*4. Ports 20*a*1 and 20*a*2 are exposed at the case exterior for user access, while plug 20*d* forms the internal electrical interface. The coupling may employ frictional, snap-fit, or sealed engagement depending on implementation.

Figure 15:
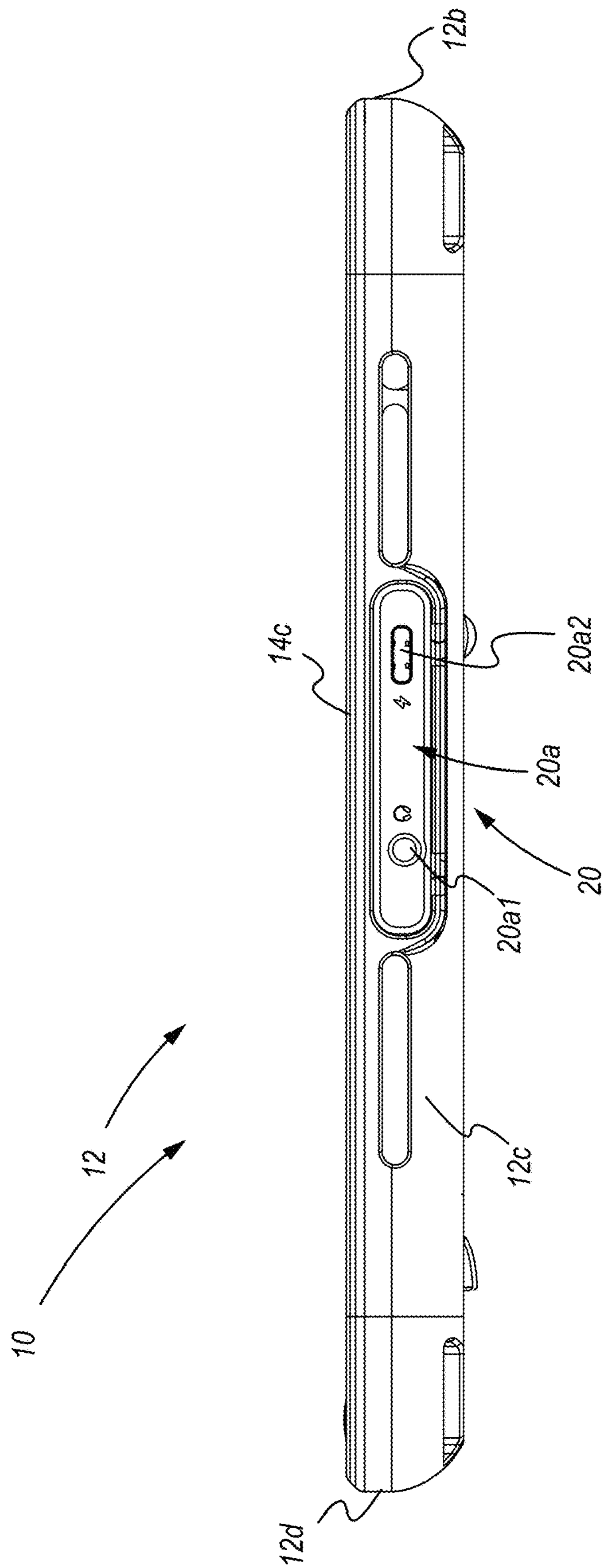
FIG. 15 is a front elevational view of the case assembly of FIG. 1 coupled with the modular port assembly of FIG. 7.

Turning to FIG. 15, depicted therein is a front elevational view of case assembly 10 coupled with modular port assembly 20. Front 20*a* of the module is positioned flush with exterior side 12*c*, and aperture 16 defines the surrounding boundary of the mounted component. Ports 20*a*1 and 20*a*2 are accessible through the exterior face, aligned horizontally within the case opening. The figure shows the module's seated configuration, with flat portion 20*b* and bevel 20*c* engaging the aperture walls to maintain alignment and sealing. In implementations, the coupling may include detents, gaskets, or compression fit to secure the module in the case wall.

Figure 16:
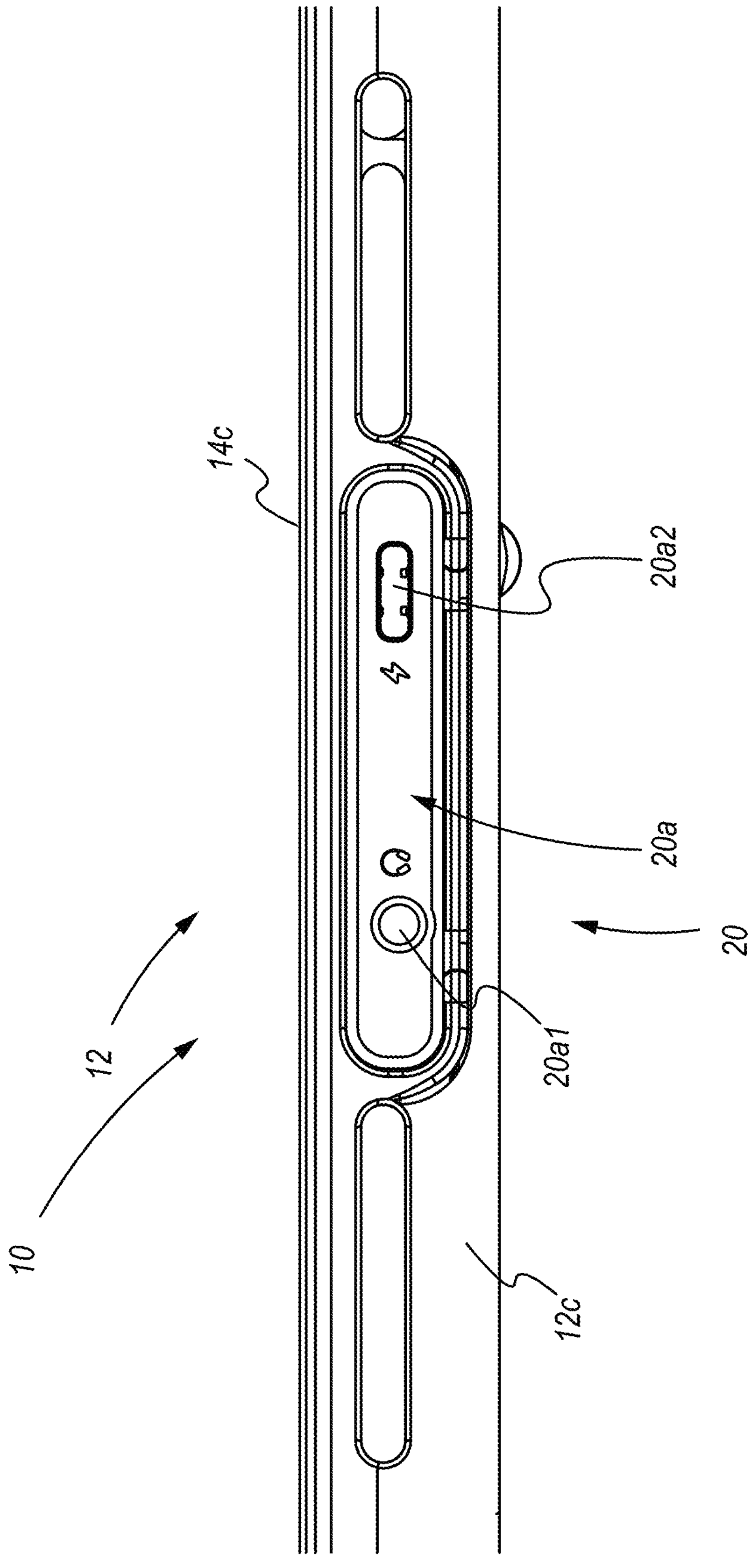
FIG. 16 is an enlarged front elevational view of a portion of the case assembly of FIG. 1 coupled with the modular port assembly of FIG. 7.

Turning to FIG. 16, depicted therein is an enlarged front-elevational view of a portion of case assembly 10 coupled with modular port assembly 20. The enlarged view details the engagement between aperture 16 and the surrounding edges of front 20*a*, showing how the module seats flush within exterior side 12*c*. Ports 20*a*1 and 20*a*2 remain exposed for external connection, while the surrounding aperture edges contact flat portion 20*b* and bevel 20*c* for mechanical retention. The interface may incorporate sealing, frictional, or snap-fit features to maintain positional stability and environmental protection.

Figure 17:
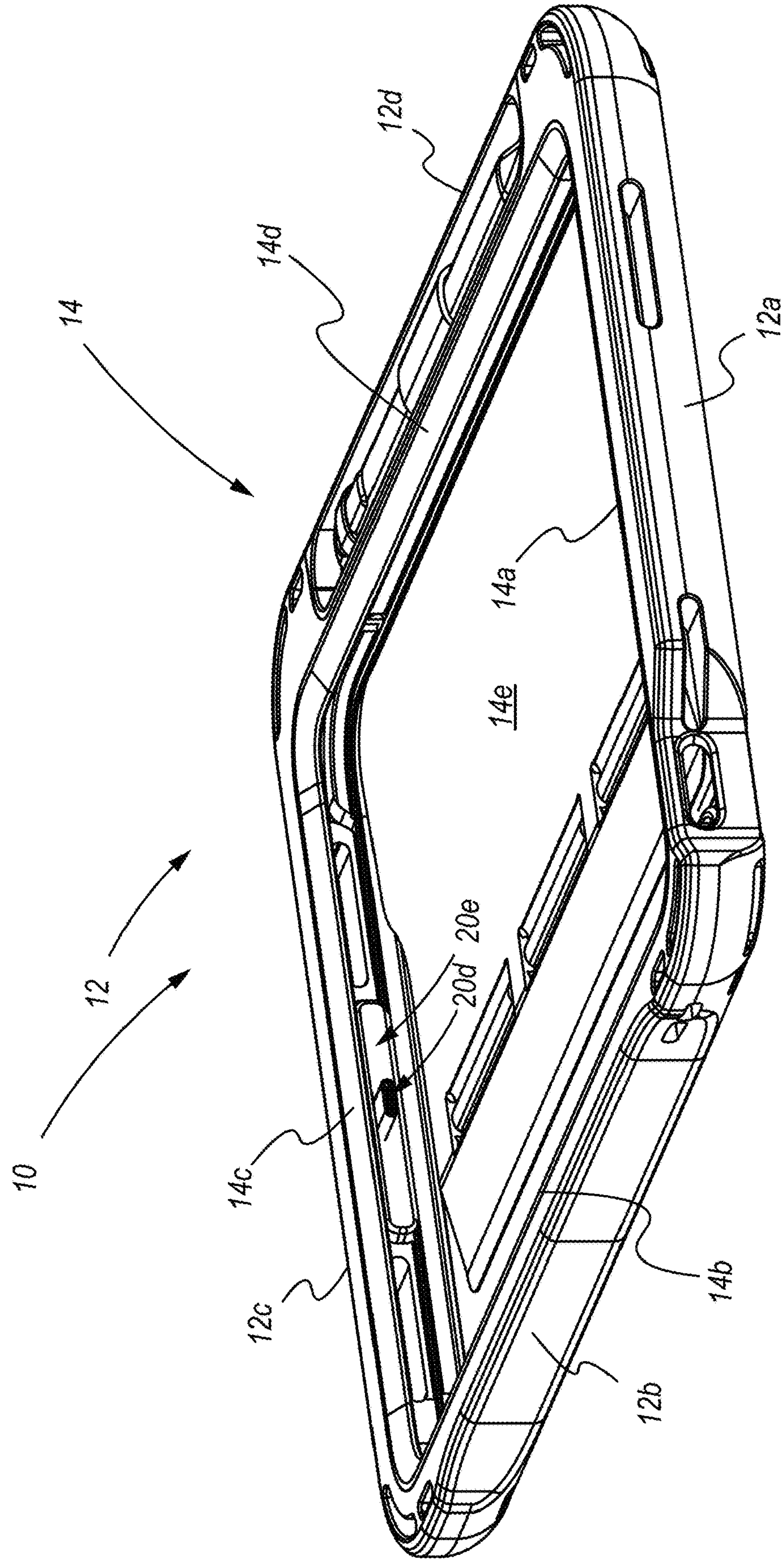
FIG. 17 is a top rear perspective view of the case assembly of FIG. 1 coupled with the modular port assembly of FIG. 7.

Turning to FIG. 17, depicted therein is a top-rear perspective view of case assembly 10 coupled with modular port assembly 20. The figure shows plug 20*d* extending inward from back 20*e* through aperture 16 into the interior region of the case. Flat portion 20*b* and bevel 20*c* are positioned within the aperture walls for seated alignment, while front 20*a* remains flush with exterior 12. The coupling demonstrates the continuous passage between the outer port openings and the internal plug interface. The interior geometry may accommodate strain-relief, gasket, or connector-support features.

Figure 18:
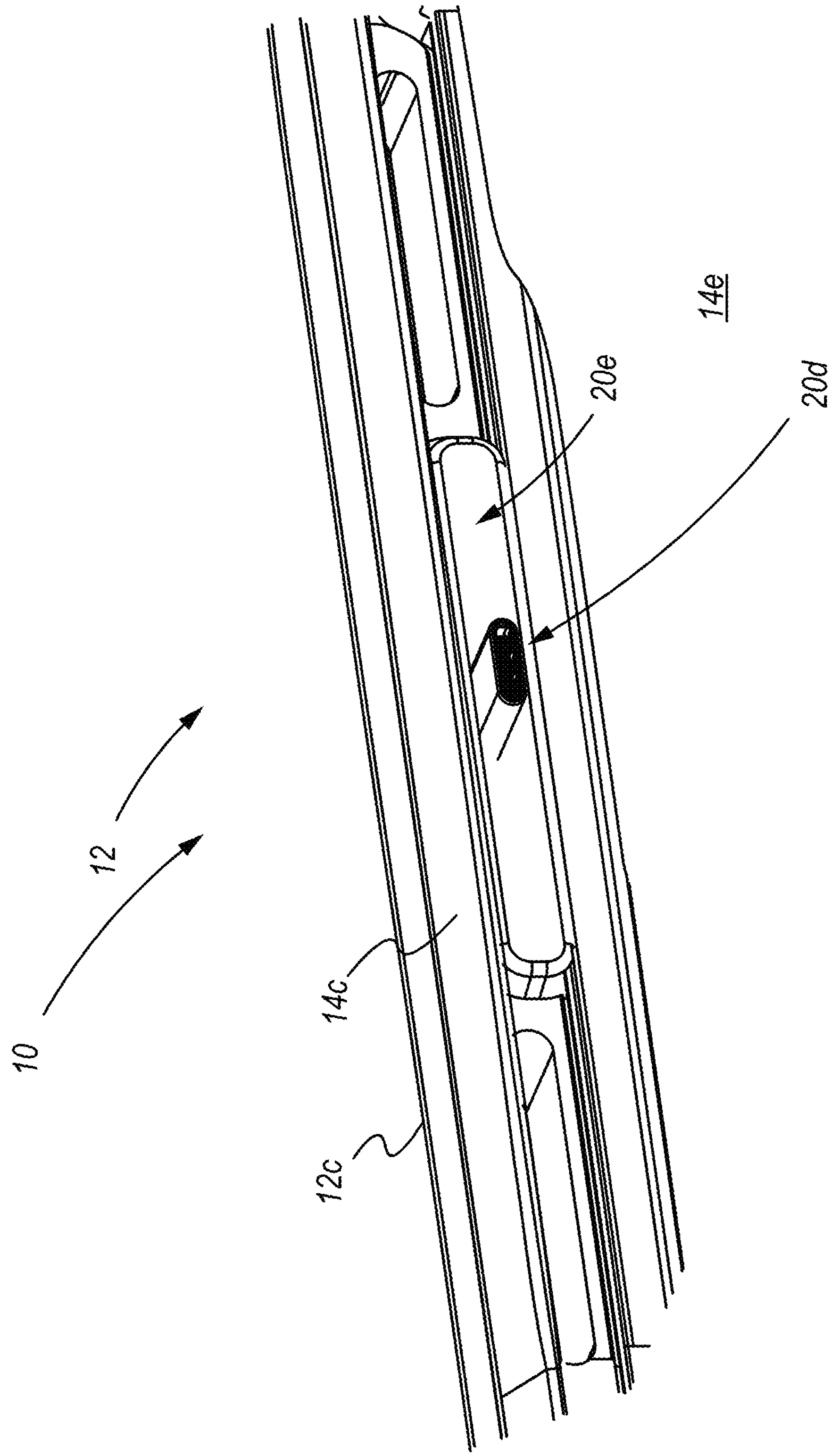
FIG. 18 is an enlarged top rear perspective view of a portion of the case assembly of FIG. 1 coupled with the modular port assembly of FIG. 7.

Turning to FIG. 18, depicted therein is an enlarged top-rear perspective view of a portion of case assembly 10 coupled with modular port assembly 20. The enlargement focuses on the engagement of plug 20*d* through aperture 16, showing how flat portion 20*b* and bevel 20*c* seat within the aperture walls. The rearward extension of plug 20*d* projects into the interior cavity of the case to align with the device's electrical port. The surrounding wall and corner geometry provide mechanical support and sealing continuity between the interior and exterior regions. Variations may include retention clips, compressive gaskets, or reinforced wall thickness for enhanced durability.

Figure 19:
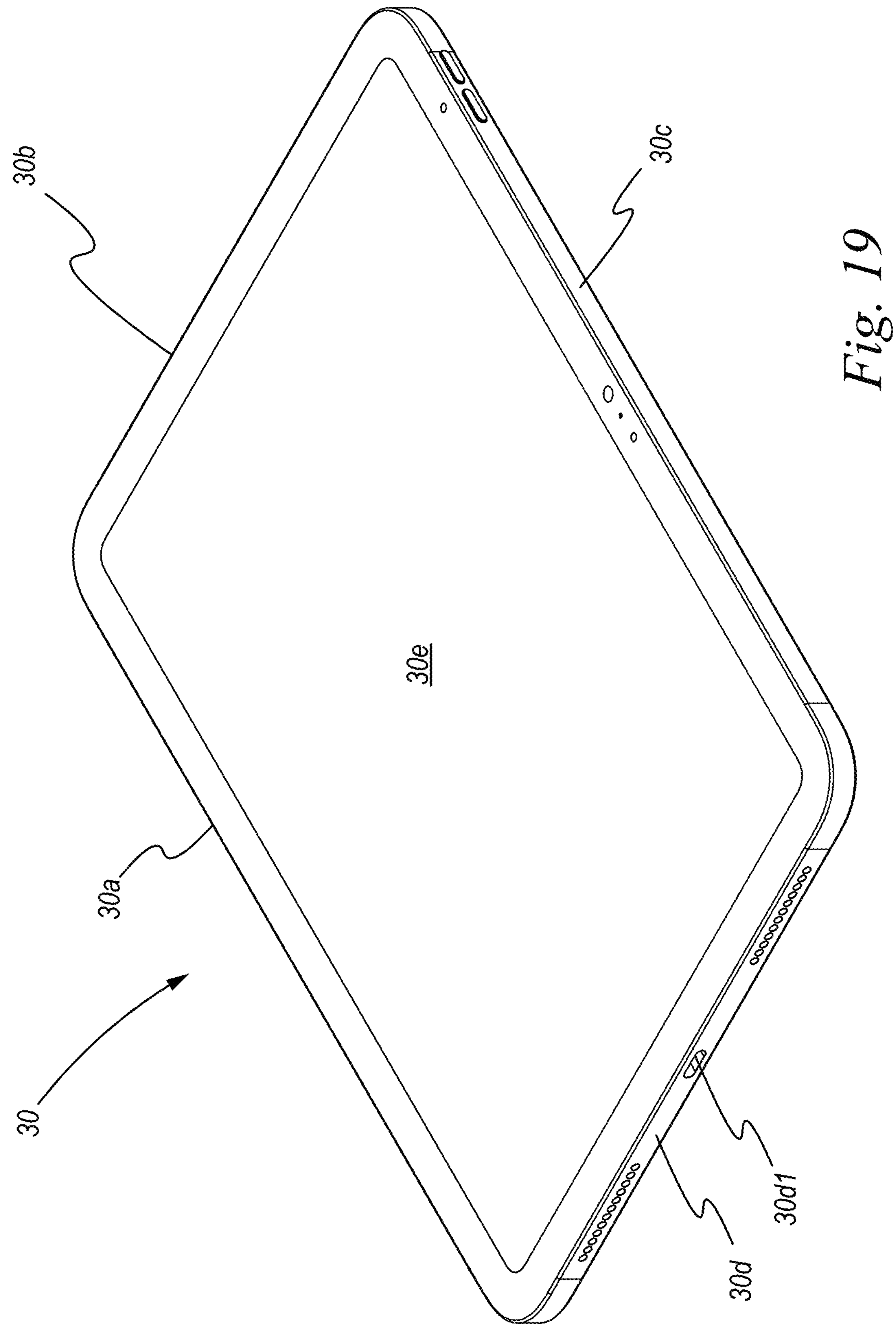
FIG. 19 is a top front perspective view of a portable electronic device.

Turning to FIG. 19, depicted therein is a top-front perspective view of portable electronic device 30 including side 30*a*, side 30*b*, side 30*c*, and side 30*d* with port 30*d*1, and display 30*e*. The device is shown in a representative rectangular form factor with the display occupying the primary front surface. Port 30*d*1 is positioned along side 30*d* for electrical coupling with an external connector or modular port assembly. The relative spacing and planar geometry of sides 30*a*-30*d* correspond to the interior cavity of case assembly 10 for seated alignment during installation.

Figure 20:
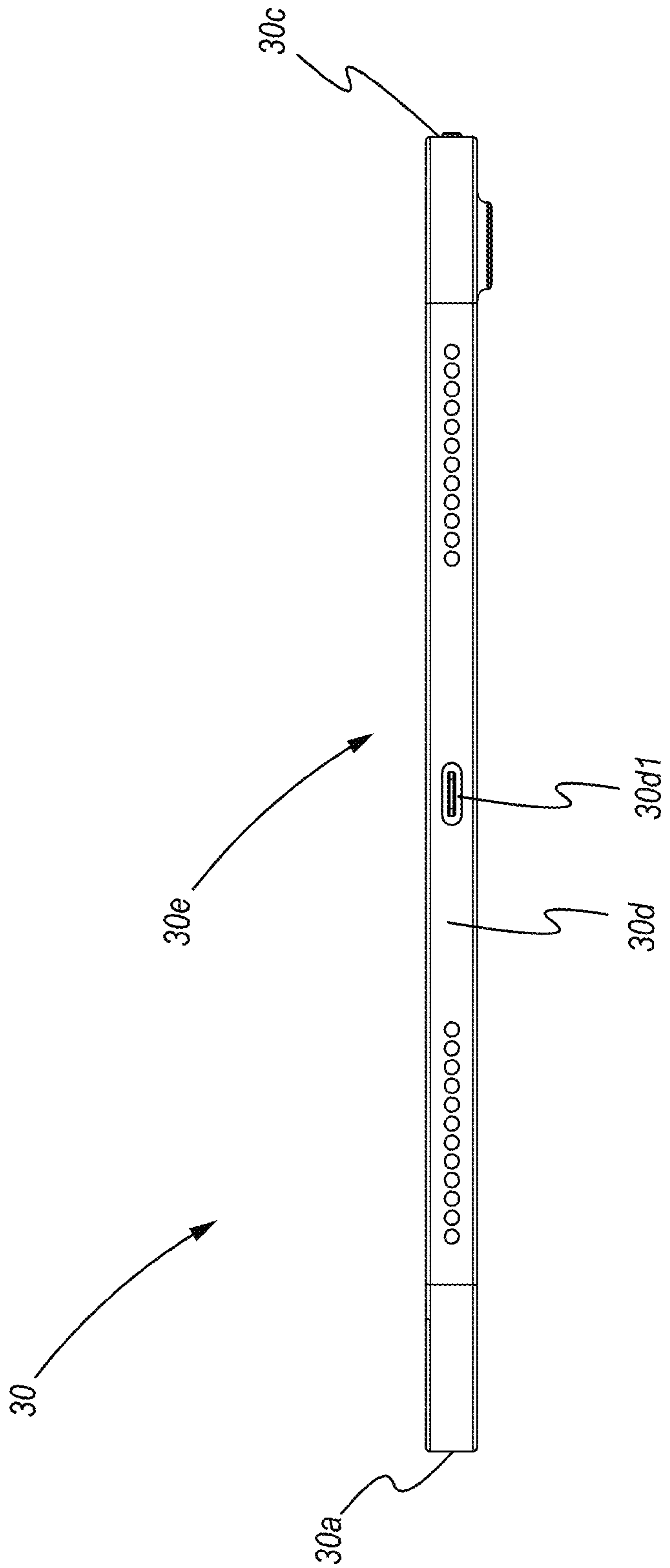
FIG. 20 is a front elevational view of the portable electronic device of FIG. 19.

Turning to FIG. 20, depicted therein is a front elevational view of portable electronic device 30 showing display 30*e* extending across the majority of the front surface. The device has a generally rectangular outline bounded by sides 30*a*, 30*b*, 30*c*, and 30*d*, which together define the enclosure. The front elevation illustrates the visible layout of the display relative to the surrounding frame or bezel region. The overall proportions may vary to accommodate differing screen sizes, bezel widths, or integrated sensors.

Figure 21:
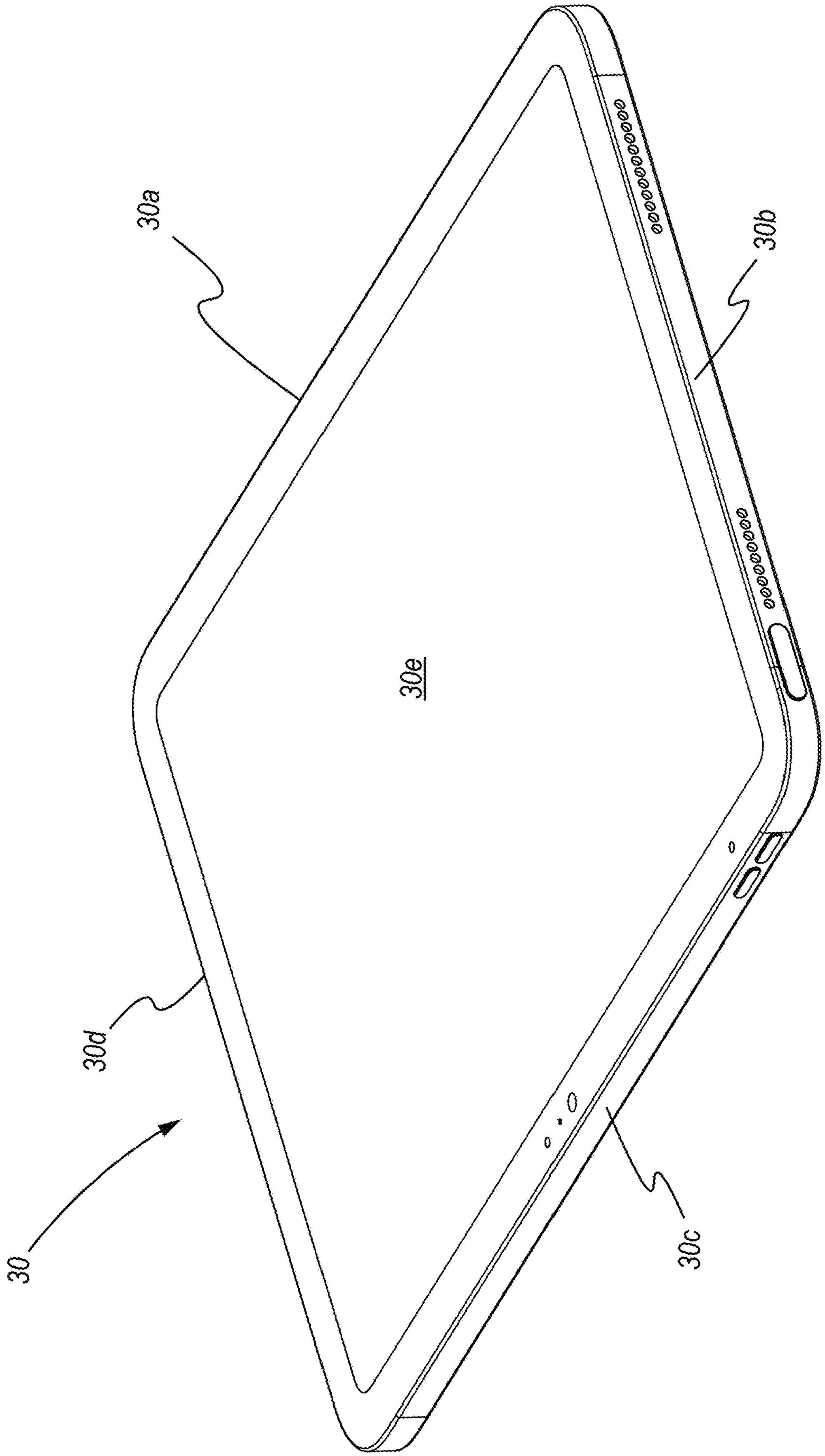
FIG. 21 is a top rear perspective view of the portable electronic device of FIG. 19.

Turning to FIG. 21, depicted therein is a top-rear perspective view of portable electronic device 30 showing the arrangement of sides 30*a*-30*d*, display 30*e*, and port 30*d*1 along side 30*d*. The rear surface is shown as a continuous panel that may include openings or contours for cameras, sensors, or cooling features depending on implementation. The orientation illustrates the position of port 30*d*1 relative to the device body for alignment with plug 20*d* of the modular port assembly when the device is installed within case assembly 10.

Figure 22:
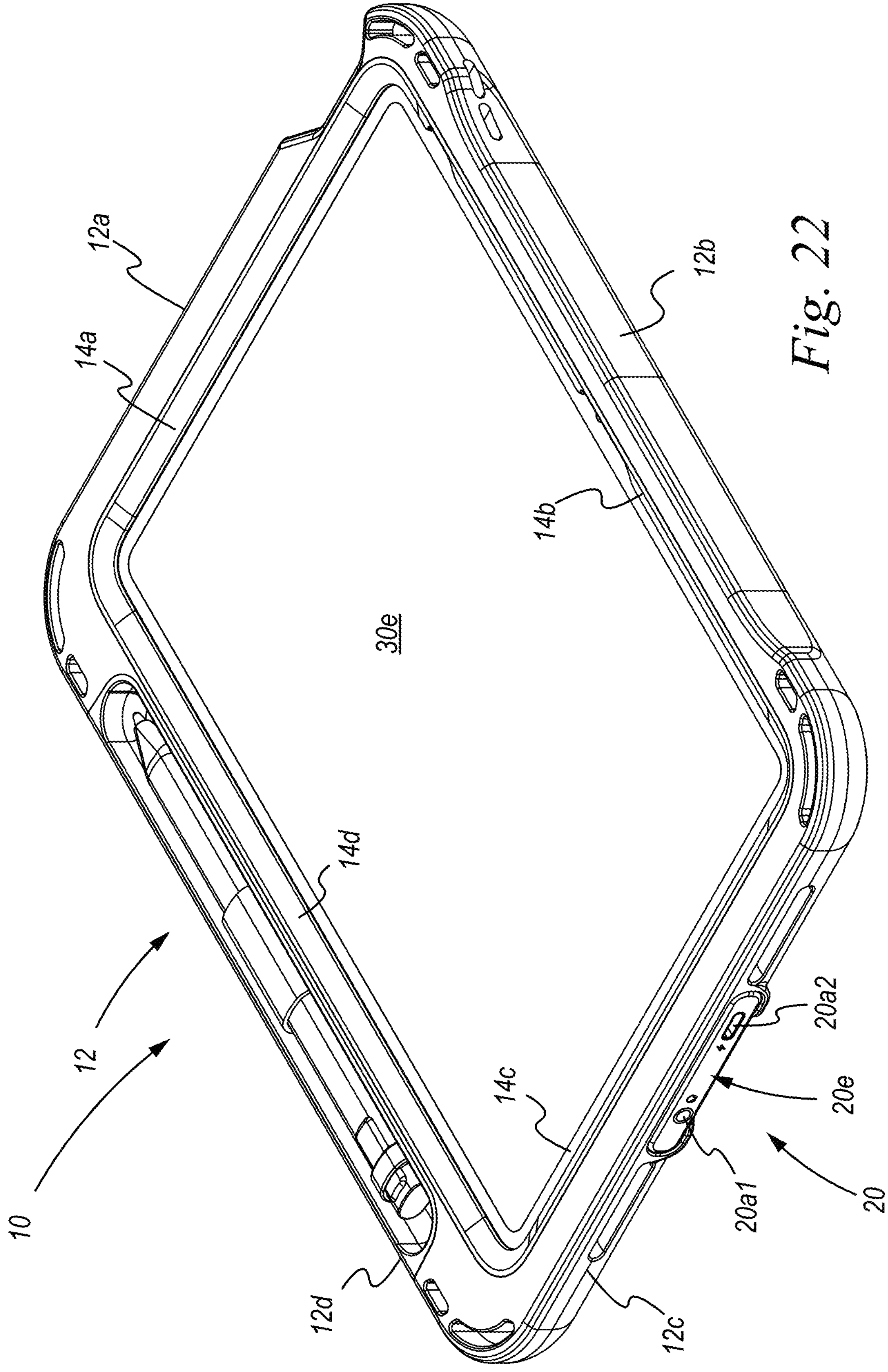
FIG. 22 is a top front perspective view of the portable electronic device of FIG. 19 coupled with the case assembly of FIG. 1 and coupled with the modular port assembly of FIG. 7.

Turning to FIG. 22, depicted therein is a top-front perspective view of portable electronic device 30 coupled with case assembly 10 and modular port assembly 20. Device 30 is seated within interior 14 of the case so that display 30*e* remains exposed and port 30*d*1 aligns with plug 20*d* of the modular port assembly. Front 20*a* of the module is positioned flush with exterior 12, while aperture 16 receives flat portion 20*b* and bevel 20*c* in seated engagement. The configuration demonstrates simultaneous mechanical support and electrical coupling among the three components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

What is claimed is:

1. A case system for a portable electronic device including an electrical port, the system comprising:
- (I) a modular port assembly including
  - (A) a front including at least one electrical port,
  - (B) a back, and
  - (C) an electrical plug extending from the back and removably electrically couplable with the electrical port of the portable electronic device; and
- (II) a case assembly including
  - (A) an interior formed in part by a base and an interior side, the interior side perpendicularly extending from the base, and
  - (B) an exterior side, and
  - (C) an aperture extending from the interior side to the exterior side,
  - wherein the interior of the case assembly is couplable with the portable electronic device, and
  - wherein the aperture is sized and shaped to couple with the modular port assembly such that when the modular port assembly is coupled with the aperture, (i) the plug of the modular port assembly extends from the back into the interior of the case assembly, (ii) the front of the modular port assembly is positioned flush with the exterior side of the case assembly, and (iii) the at least one electrical port of the front is exposed at the exterior side of the case assembly for user access.

2. The system of claim 1
- wherein the aperture has at least one beveled surface, and
- wherein the modular port assembly has at least one beveled surface that is positioned between the front and the back of the modular port assembly and that has with slope to engage the at least one beveled surface of the aperture when the modular port assembly is coupled with the aperture and the front of the modular port assembly is positioned flush with the exterior side of the case assembly.

3. The system of claim 2
- wherein the aperture has at least one flat surface, and
- wherein the modular port assembly has at least one flat surface that is positioned between the front and the at least one beveled surface of the modular port assembly to engage with the at least one flat surface of the aperture when the modular port assembly is coupled with the aperture.

4. The system of claim 3
- wherein the aperture has at least one width defined between opposing sides of the aperture, and
- wherein the modular port assembly has at least one width defined between opposing sides of the modular port assembly along the at least one flat surface of the modular port assembly to engage the at least one width of the aperture when the modular port assembly is coupled with the aperture.

5. The system of claim 1
- wherein the aperture has at least one length, and
- wherein the modular port assembly has at least one length defined between the front and the back of the modular port assembly to engage the at least one length of the aperture when the modular port assembly is coupled with the aperture.

6. The system of claim 1
wherein the plug complies with at least one universal serial bus standard.

7. The system of claim 1
wherein the plug complies with a networking standard.

8. The system of claim 1
wherein the plug complies with at least one IEEE 802 standard.

9. The system of claim 1
wherein the at least one electrical port is an audio port.

10. The system of claim 1
wherein the at least one electrical port is an electrical power port.

11. The system of claim 1
wherein the at least one electrical port is a video port.

12. The system of claim 1
wherein the at least one electrical port is a network communication port.

13. The system of claim 1
wherein the at least one electrical port complies with at least one IEEE 802 standard.

14. The system of claim 1
wherein the at least one electrical port complies with at least one universal serial bus standard.

15. A case system for a portable electronic device including an electrical port, the system comprising:
(I) a modular port assembly including
(A) a front including at least one electrical port a plurality of electrical ports,
(B) a back, and
(C) an electrical plug extending from the back and removably electrically couplable with the electrical port of the portable electronic device; and
(II) a case assembly including
(A) an interior formed in part by a base and an interior side, the interior side perpendicularly extending from the base, and
(B) an exterior side, and
(C) an aperture extending from the interior side to the exterior side,
wherein the interior of the case assembly is couplable with the portable electronic device, and
wherein the aperture is sized and shaped to couple with the modular port assembly such that when the modular port assembly is coupled with the aperture, (i) the plug of the modular port assembly extends from the back into the interior of the case assembly, (ii) the front of the modular port assembly is positioned flush with the exterior side of the case assembly, and (iii) the plurality of electrical ports of the front are exposed at the exterior side of the case assembly for user access.

16. The system of claim 15
wherein the plug complies with at least one universal serial bus standard.

17. The system of claim 15
wherein the at least one of the plurality of electrical ports is an audio port.

18. A case system for a portable electronic device including an electrical port, the system comprising:
(I) a modular port assembly including
(A) a front including at least one electrical port,
(B) a flat portion,
(C) a beveled portion positioned between the flat portion and a back of the modular port assembly,
(D) the back, and
(E) an electrical plug extending from the back and removably electrically couplable with the electrical port of the portable electronic device; and
(II) a case assembly including
(A) an interior,
(B) an exterior side, and
(C) an aperture,
wherein the interior is couplable with the portable electronic device, and
wherein the aperture is sized and shaped to couple with the modular port assembly such that when the modular port assembly is coupled with the aperture, (i) the plug of the modular port assembly extends from the back into the interior of the case assembly, (ii) the flat portion and the beveled portion of the modular port assembly are received in the aperture, (iii) the front of the modular port assembly is positioned flush with the exterior side of the case assembly, and (iv) the at least one electrical port of the front is exposed at the exterior side of the case assembly for user access.

19. The system of claim 18
wherein the at least one electrical port of the front is an electrical power port.

20. The system of claim 18
wherein the at least one electrical port of the front complies with at least one universal serial bus standard.

* * * * *